United States Patent
Yamada et al.

(10) Patent No.: US 7,482,689 B2
(45) Date of Patent: Jan. 27, 2009

(54) MICROCOMPUTER

(75) Inventors: Kenji Yamada, Nukata-gun (JP);
Chikara Kobayashi, Kodaira (JP)

(73) Assignee: DENSO CORPORATION, Kariya (JP)

( * ) Notice: Subject to any disclaimer, the term of this patent is extended or adjusted under 35 U.S.C. 154(b) by 169 days.

(21) Appl. No.: 11/709,277

(22) Filed: Feb. 22, 2007

(65) Prior Publication Data

US 2007/0208960 A1  Sep. 6, 2007

(30) Foreign Application Priority Data

Feb. 24, 2006 (JP) .............................. 2006-048468

(51) Int. Cl.
*H01L 23/48* (2006.01)
(52) U.S. Cl. ...................... 257/723; 257/678
(58) Field of Classification Search ................. 257/678, 257/723; 713/300
See application file for complete search history.

(56) References Cited

U.S. PATENT DOCUMENTS

| | | | |
|---|---|---|---|
| 6,657,911 B2 | 12/2003 | Yamaoka et al. | |
| 6,903,962 B2 * | 6/2005 | Nii | 365/156 |
| 6,914,803 B2 | 7/2005 | Yamaoka et al. | |
| 7,023,757 B2 * | 4/2006 | Watanabe et al. | 365/227 |
| 7,099,183 B2 | 8/2006 | Yamaoka et al. | |
| 7,173,875 B2 * | 2/2007 | Chan et al. | 365/230.06 |
| 7,221,581 B2 * | 5/2007 | Jacquet et al. | 365/154 |
| 7,272,068 B2 * | 9/2007 | Yamaoka et al. | 365/226 |
| 2006/0268647 A1 | 11/2006 | Yamaoka et al. | |

* cited by examiner

*Primary Examiner*—Roy K Potter
(74) *Attorney, Agent, or Firm*—Posz Law Group, PLC

(57) ABSTRACT

A microcomputer having a sleep mode includes first and second chips received in a single package. The first and second chips are manufactured with different manufacturing processes such that a leak current in the first chip is less than that in the second chip. When a sleep signal for putting the microcomputer in the sleep mode becomes active, data stored in the second chip is transmitted to the first chip. After the data transmission is completed, a power supply voltage supplied to the second chip is stopped and the second chip stops its operation until the sleep mode is released. The data transmission is achieved by digital logic circuits that can be easily redesigned by using a conventional automatic layout generator.

6 Claims, 4 Drawing Sheets

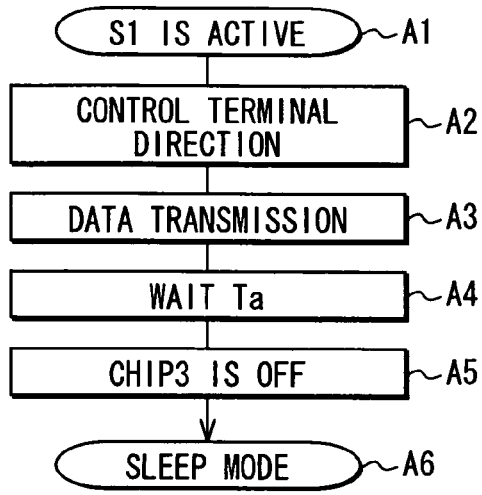
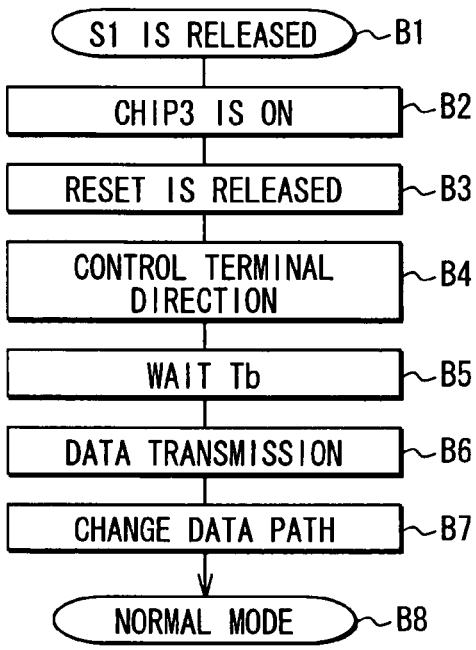
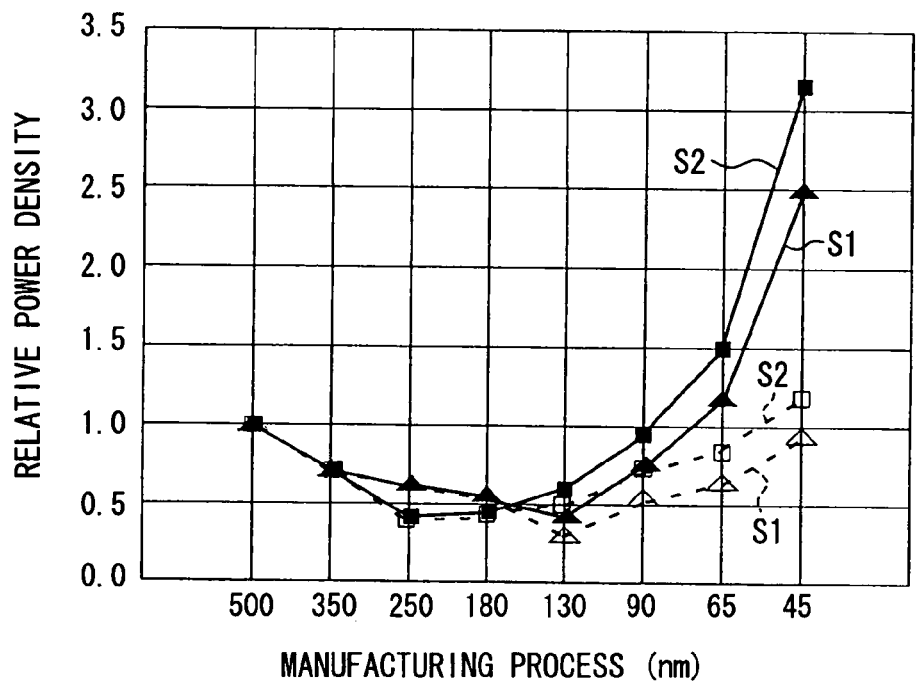

MICROCOMPUTER

CROSS REFERENCE TO RELATED APPLICATION

This application is based on and incorporates herein by reference Japanese Patent Application No. 2006-48468 filed on Feb. 24, 2006.

FIELD OF THE INVENTION

The present invention relates to a microcomputer including a first chip that continues operation in a sleep mode and a second chip that stops operation in the sleep mode.

BACKGROUND OF THE INVENTION

Typically, an integrated circuit (IC) such as a microcomputer has a sleep mode (i.e., low power consumption mode) that reduces power consumption. The sleep mode stops supply of clock signals to most of logic circuits in the IC so that the logic circuits stop operation.

A manufacturing process technology of the IC is advanced and the IC is manufactured with a finer (e.g., 90 nm) manufacturing process. In other words, the number of transistors per chip is increased so that the transistors have a reduced minimum line-width. Such an IC operates at a lower voltage and the transistors have a reduced threshold voltage. Therefore, a leak current occurs regardless of whether the logic circuits operate and the power consumption in the sleep mode is increased.

A semiconductor device disclosed in U.S. Pat. No. 6,657, 911 corresponding to JP-2003-132683A includes a logic circuit, a SRAM circuit for storing data processed by the logic circuit, and a control circuit for controlling a substrate bias applied to the SRAM circuit. In a sleep mode of the semiconductor device, a power supply voltage supplied to the logic circuit is stopped and the control circuit controls the substrate bias to reduce a leak current.

The control circuit for controlling the substrate bias is constructed with an analog circuit such as a charge pump circuit. However, an automatic layout generator for an analog circuit has not been advanced yet. Therefore, when a manufacturing process of the semiconductor device is changed (e.g., from 90 nm to 65 nm), the semiconductor device needs to be manually redesigned.

SUMMARY OF THE INVENTION

In view of the above-described problem, it is an object of the present invention to provide a microcomputer having a digital logic circuit used for reducing a leak current in a sleep mode.

A microcomputer includes first and second chips received in a single package. The first and second chips are manufactured with different manufacturing processes such that a first leak current in the first chip is less than a second leak current in the second chip.

The microcomputer has a normal mode and a sleep mode. In the normal mode, a power supply circuit supplies a first voltage to the first chip and a second voltage to the second chip. The first chip is supplied with the first voltage and continues its operation even in the sleep mode. In contrast, the second chip 3 stops its operation in the sleep mode because the supply of the second voltage to the second chip is stopped.

The first and second chips have first and second memories, respectively. When a sleep signal becomes active, data stored in the second memory of the second chip is transmitted to the first memory of the first chip. When the data transmission is completed, the supply of the second voltage to the second chip is stopped and the microcomputer switches to the sleep mode.

Thus, the data stored in the second chip is backed up in the first chip during the sleep mode. Since the first leak current in the first chip is less than the second leak current in the second chip, power consumption for backing up the data during the sleep mode can be reduced. The data transmission is achieved by digital logic circuits that can be easily redesigned by using a conventional automatic layout generator. Therefore, even when the manufacturing processes are changed, the microcomputer can be easily redesigned.

BRIEF DESCRIPTION OF THE DRAWINGS

The above and other objectives, features and advantages of the present invention will become more apparent from the following detailed description made with reference to the accompanying drawings. In the drawings:

FIG. 4 is a flow chart showing processes performed when the microcomputer switches from a normal mode to a sleep mode;

FIG. 5 is a flow chart showing processes performed when the microcomputer switches from the sleep mode to the normal mode; and FIG. 6 is a graph showing a relationship between a relative power density and a manufacturing process of a semiconductor chip.

DETAILED DESCRIPTION OF THE PREFERRED EMBODIMENT

Figure 1:
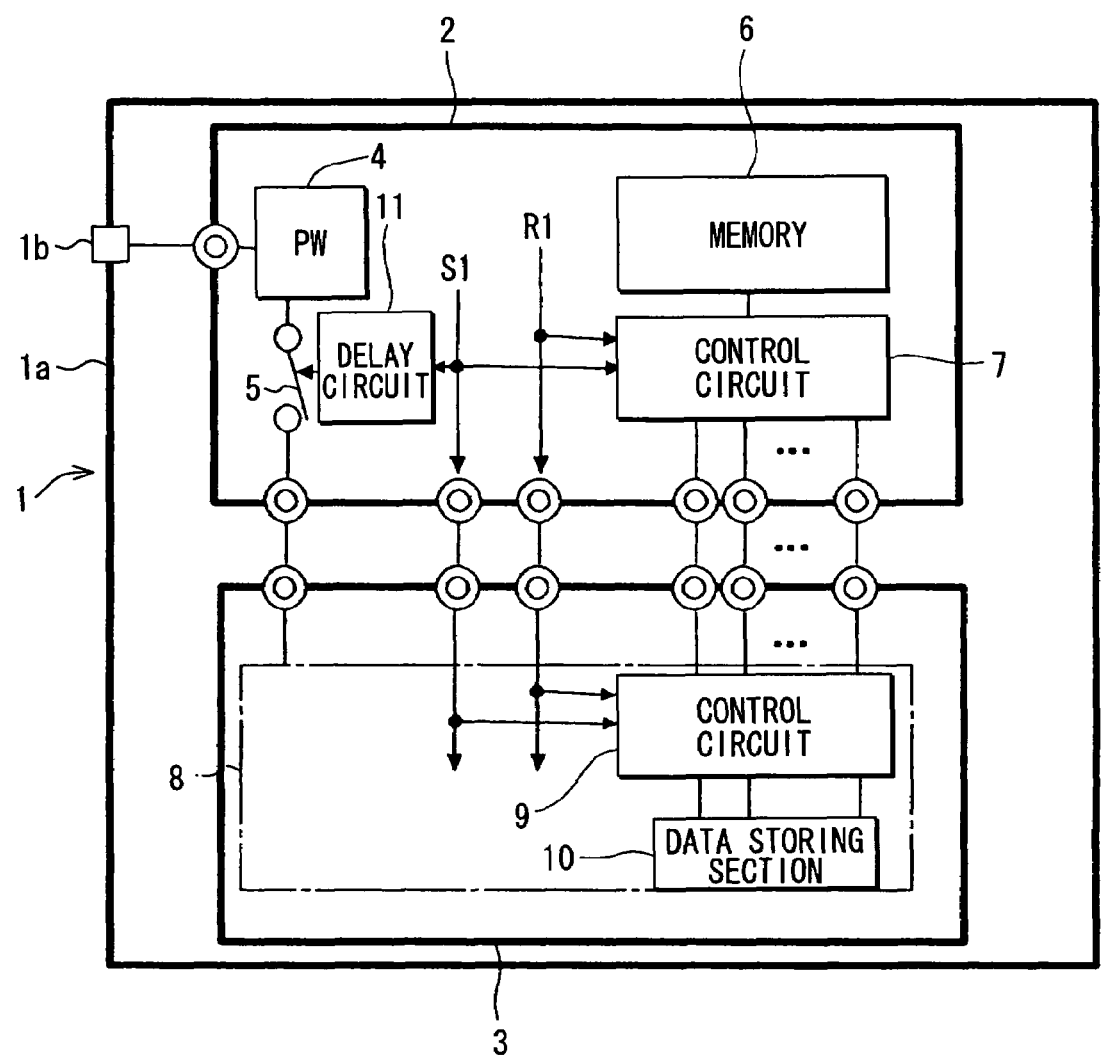
FIG. 1 is a block diagram of a microcomputer according to an embodiment of the present invention.

As shown in FIG. 1, a microcomputer 1 according to an embodiment of the present invention includes a package 1a and first and second chips 2, 3 received in the package 1a. The first and second chips 2, 3 are manufactured with different manufacturing processes such that a first leak current in the first chip 2 is less than a second leak current in the second chip 3. Typically, the manufacturing process is denoted by a minimum line-width on the integrated circuits. For example, the first chip 2 is manufactured with a 350 nm manufacturing process and operates at a first voltage of 3.3 volts (V). The second chip 3 is manufactured with a 150 nm manufacturing process and operates at a second voltage of 1.5 V. In short, the first chip 2 has a first integration degree less than a second integration degree of the second chip 3 and has a first minimum line-width greater than a second minimum line-width of the second chip 3. Therefore, for example, a metal-oxide semiconductor field-effect transistor (MOSFET) in the first chip 2 has a higher threshold voltage than that in the second chip 3. Thus, a first leak current in the first chip 2 is less than a second leak current in the second chip 3.

FIG. 6 is a graph showing a relationship between a relative power density and a manufacturing process of sample semiconductor chips S1, S2. In FIG. 6, broken lines represent the case where a leak current occurs in the sample chips S1, S2 and solid lines represent the case where no leak current occurs in the sample chips S1, S2.

As can be seen from FIG. 6, when the sample chips S1, S2 are manufactured with the 350 nm manufacturing process, the relative power density is approximately constant regardless of the leak current. Therefore, the leak current can be substantially negligible.

In contrast, when the sample chips S1, S2 are manufactured with the 150 nm manufacturing process, the leak current increases the relative power density. Therefore, the leak current cannot be negligible.

Returning to FIG. 1, the first chip 2 includes a power supply circuit 4, a switch 5, a first memory 6, a first control circuit 7, and a delay circuit 11. The second chip 3 includes a logic section 8 having a second control circuit 9 and a data storing section 10.

The power supply circuit 4 generates the first voltage of 3.3 V and the second voltage of 1.5 V from a power supply voltage (e.g., between 12 V and 14 V) supplied through a terminal 1b of the package 1a. The second voltage of 1.5 V is supplied to the second chip 3 via the switch 5.

The first and second control circuits 7, 9 operate in conjunction with each other to control data transmission between the first memory 6 and the data storing section 10. The first chip 2 includes a first central processing unit (CPU), which is not shown in the drawings. The first CPU outputs a sleep signal S1 and a reset signal R1 to each of the first and second control circuits 7, 9 in accordance with operating conditions of the microcomputer 1. The sleep signal S1 is also fed to the switch 5 through the delay circuit 11 and the switch 5 is controlled by the sleep signal S1. The microcomputer 1 switches to a sleep mode in response to the sleep signal S1.

The first chip 2 continues its operation even in the sleep mode. In contrast, the second chip 3 stops its operation in the sleep mode because the switch 5 interrupts the supply of the second voltage of 1.5 V to the second chip 3. As described in detail below, data stored in the data storing section 10 of the second chip 3 is transmitted to the first memory 6 of the first chip 2, before the switch 5 interrupts the supply of the second voltage of 1.5 V to the second chip 3.

Figure 2:
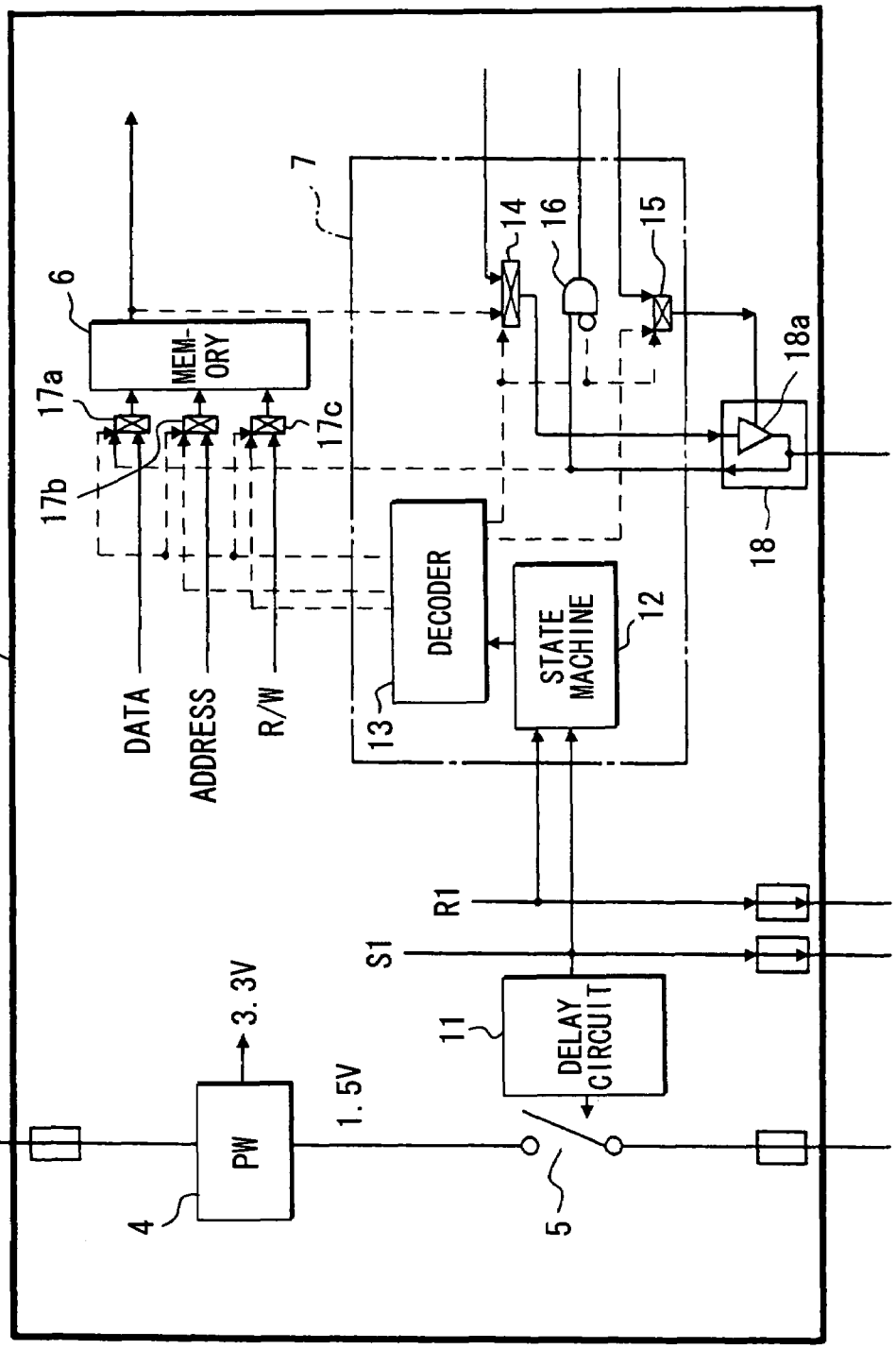
FIG. 2 is a block diagram of a first chip of the microcomputer.

As shown in detail in FIG. 2, the first chip 2 further includes multiplexers 17a-17c and a first two-way terminal 18 having an output buffer 18a. Each of the multiplexers 17a-17c has first and second inputs and an output connected to the first memory 6. The first control circuit 7 of the first chip 2 includes a state machine 12, a decoder 13, multiplexers 14, 15, and an AND-gate 16.

When the microprocessor 1 operates in a normal mode, the first CPU reads and writes data from and to the first memory 6 via a first internal bus. Specifically, the first CPU outputs the data, an address signal, and a read/write control signal to the first inputs of the multiplexers 17a-17c, respectively. The decoder 13 of the first control circuit 7 causes each of the multiplexers 17a-17c to select the first input in the normal mode. The first control circuit 7 does not dynamically operate in the normal mode.

When the microprocessor 1 switches to the sleep mode, the first control circuit 7 operates so that data stored in the data storing section 10 is transmitted to the first memory 6. To perform the data transmission, not only the first CPU but also the first control circuit 7 can output the data, the address signal, and the read/write control signal to the first memory 6 through the multiplexers 17a-17c.

Specifically, when the data transmission is performed, the decoder 13 causes each of the multiplexers 17a-17c to select the second input. The data is transmitted from the second chip 3 to the first chip 2 through the first two-way terminal 18 and fed to the second input of the multiplexer 17a. The address signal is outputted from the decoder 13 of the first control circuit 7 to the second input of the multiplexer 17b. The read/write control signal is outputted from the decoder 13 to the second input of the multiplexer 17c. Further, the decoder 13 outputs a control signal to a negative input of the AND-gate 16 in the sleep mode in order to prevent the AND-gate 16 from placing the data transmitted through the two-way terminal 18 on the first internal bus. Thus, a data value on the first internal bus is fixed to zero in the sleep mode.

The data read from the first memory 6 is transmitted to the second chip 3 via the first control circuit 7 and the first two-way terminal 18. Specifically, the data outputted from the first memory 6 is fed to a first input of the multiplexer 14 and the data outputted from the first CPU or the like via the first internal bus is fed to a second input of the multiplexer 14. An output of the multiplexer 14 is connected to an input of the output buffer 18a of the first two-way terminal 18.

The multiplexer 15 has a first input connected to the decoder 13, a second input connected to the first CPU or the like via the first internal bus, and an output connected to an enable control terminal of the output buffer 18a. The output buffer 18a is controlled by the first CPU in the normal mode and controlled by the decoder 13 at the time of transition between the normal mode and the sleep mode. Each of the multiplexers 14, 15 selects one of the first and second inputs in accordance with the control signal outputted from the decoder 13. Thus, the multiplexers 14, 15 and the AND-gate 16 are controlled by the control signal outputted from the decoder 13.

Figure 3:
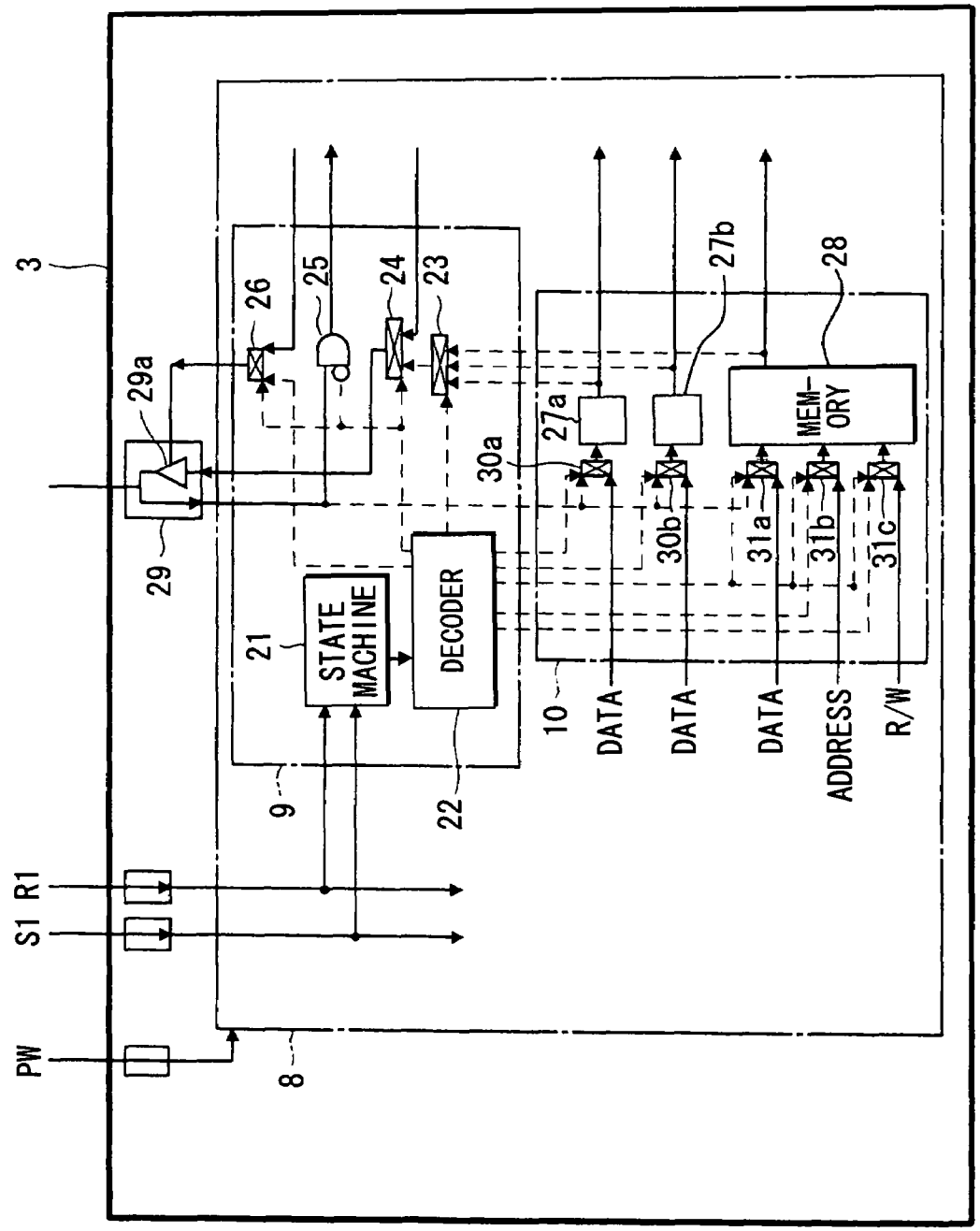
FIG. 3 is a block diagram of a second chip of the microcomputer.

In FIGS. 2 and 3, solid lines represent a first signal path used in the normal mode and dashed lines represent a second signal path used at the time of transition between the normal mode and the sleep mode.

As shown in detail in FIG. 3, the second chip 3 further includes a second two-way terminal 29 having an output buffer 29a. The second control circuit 9 of the second chip 3 includes a state machine 21, a decoder 22, multiplexers 23-25, and an AND-gate 26. The data storing section 10 includes two flip-flops 27a, 27b, a second memory 28, multiplexers 30a, 30b, and multiplexers 31a-31c.

When the microprocessor 1 operates in the normal mode, a second CPU in the second chip 3 reads and writes data from and to the data storing section 10 via a second internal bus.

When the microprocessor 1 switches to the sleep mode, the second control circuit 9 operates so that the data stored in the data storing section 10 is transmitted to the first memory 6. To perform the data transmission, outputs of the fillip-flop circuits 27a, 27b, and the second memory 28 are connected to three inputs of the multiplexer 23, respectively. An output of the multiplexer 23 is connected to a first input of the multiplexer 24 and an output of the multiplexer 24 is connected to an input of the output buffer 29a of the second two-way terminal 29. A second input of the multiplexer 24 is connected to the second internal bus. The multiplexer 23 selects one of the three inputs in accordance with a control signal outputted from the decoder 22. Also, the multiplexer 24 selects one of the first and second inputs in accordance with the control signal.

The data inputted to the second chip 3 via the second two-way terminal 29 is placed on the second internal bus via the AND-gate 26. The decoder 22 outputs a control signal to a negative input of the AND-gate 26 in the sleep mode in order to prevent the AND-gate 26 from placing the data transmitted through the two-way terminal 29 on the second internal bus. Thus, a data value on the second internal bus is fixed to zero in the sleep mode.

The multiplexer 25 has a first input connected to the decoder 22, a second input connected to the second CPU or the like via the second internal bus, and an output connected to an enable control terminal of the output buffer 29a. The output buffer 29a is controlled by the second CPU in the normal mode and controlled by the decoder 22 at the time of transition between the normal mode and the sleep mode. Each of the multiplexers 24, 25 selects one of the first and second inputs in accordance with the control signal outputted from the decoder 22. Thus, the multiplexers 24, 25 and the AND-gate 26 are controlled by the control signal outputted from the decoder 22.

The decoder 22 writes the data transmitted from the first chip 2 to the data storing section 10. Each of the multiplexers 30a, 30b has first and second inputs. An output of the multiplexer 30a is connected to the flip-flop 27a and an output of the multiplexer 30b is connected to the flip-flop 27b. Each of the multiplexers 31a-31c has first and second inputs and an output connected to the second memory 28. The second CPU outputs the data to the first inputs of the multiplexers 30a, 30b, and 31a. The second CPU outputs an address signal and a read/write control signal to the first inputs of the multiplexers 31b, 31c, respectively. The data transmitted through the two-way terminal 29 is fed to the second inputs of the multiplexers 30a, 30b, and 31a. The decoder 22 outputs the address signal and the read/write control signal to the second inputs of the multiplexers 31b, 31c, respectively. The decoder 22 independently controls the multiplexers 30a, 30b and collectively controls the multiplexers 31a-31c.

Since the first and second chips 2, 3 operate at different voltages, data level in the first chip 2 is different from that in the second chip 3. Therefore, level conversion is performed between the first and second two-way terminals 18, 29.

A first process shown in FIG. 4 is performed during the transition from the normal mode to the sleep mode. The first process starts at step A1 where the sleep signal S1 becomes active. Then, the first process proceeds to step A2 where the state machines 12, 21 perform a state transition to transmit data between the first and second chips 2, 3. Then, the decoders 13, 22 perform control operations in accordance with each state.

Specifically, in step A2, the decoder 13 disables the output buffer 18a so that the two-way terminal 18 acts as the input terminal and the decoder 22 enables the output buffer 29a so that the two-way terminal 29 acts as the output terminal.

Then, the first process proceeds to step A3 where the decoder 22 controls the multiplexers 23, 24 so that the data stored in the flip-flops 27a, 27b is outputted to the first chip 2. Further, the decoder 22 reads and outputs the data stored in the second memory 28 to the second chip 2. The decoder 13 sequentially writes the data transmitted from the second chip 3 to predetermined regions of the first memory 6. Thus, the decoder 22 operates in conjunction with the decoder 13 so as to act as a direct memory access (DMA) controller.

Then, the first process proceeds to step A4 where the delay circuit 11 waits a time period Ta. The first time period Ta is longer than a time period from when the sleep signal S1 becomes active to when the data transmission performed at step A3 to be completed.

When the first time period Ta expires, the first process proceeds to step A5 where the switch 5 is opened to stop the supply of the second voltage of 1.5 V to the second chip 3. As a result, the second chip 3 stops its operation and the data stored in the flip-flops 27a, 27b, and the second memory 28 is lost. Further, in step A5, the decoder 13 enables the output buffer 18a so that the two-way terminal 18 acts as the output terminal.

Then, the first process proceeds to step A6 where the microcomputer 1 switches to the sleep mode. The second chip 2 is supplied with the first voltage of 3.3 V from the power supply circuit 4 even in the sleep mode. Therefore, the data written to the memory 6 is backed up during the sleep mode.

A second process shown in FIG. 5 is performed during the transition from the sleep mode to the normal mode. The second process starts at step B1 where the sleep signal S1 becomes inactive. Then, the second process proceeds to step B2 where the switch 5 is closed through the delay circuit 11. As a result, the power supply circuit 4 resumes the supply of the second voltage of 1.5 V to the second chip 3.

Then, the second process proceeds to step B3 where the reset of the second chip 3 is released by the reset signal R1 generated in the first chip 2.

Then, the second process proceeds to step B4 where the decoder 22 disables the output buffer 29a in response to the reset signal R1 so that the two-way terminal 29 acts as the input terminal. Further, the decoder 13 enables the output buffer 18a so that the two-way terminal 18 acts as the output terminal.

Then, the second process proceeds to step B5 where a second time period Tb required for the second chip 3 to boot up is waited.

When the second time period Tb expires, the second process proceeds to step B6 where the decoder 13 reads and transmits the data, which is written to the first memory 6 in step A3, to the second chip 3. The decoder 22 sequentially writes the data transmitted from the first chip 2 to the flip-flops 27a, 27b and the second memory 28. Thus, the data storing section 10 returns to its state before the sleep mode.

Then, the second process proceeds to step B7 where the decoders 13, 22 controls the multiplexers to change data paths related to the two-way terminals 18, 29 to the normal mode side.

Then, the second process proceeds to step B8 where the microcomputer 1 returns to the normal mode.

As described above, the microcomputer 1 is a multi-chip module and includes the first and second chips 2, 3 that received in the package 1a. The first and second chips 2, 3 are manufactured with different manufacturing processes such that the leak current in the first chip 2 is less than that in the second chip 3.

In the sleep mode, the first chip 2 is supplied with the first power voltage and continues its operation. In contrast, the supply of the second power voltage to the second chip 3 is stopped so that the second chip 3 stops its operation. The data transmission from the second chip 3 to the first chip 2 is completed, before the switch 5 interrupts the supply of the second power voltage to the second chip 3.

The first chip 2 includes the state machine 12 and the decoder 13 and the second chip 3 includes the state machine 21 and the decoder 22. When the sleep signal S1 becomes active, the state machines 12, 21 operate to synchronize control states between the first and second chips 2, 3. Thus, the data transmission from the second chip 3 to the first chip 2 is achieved.

The data stored in the data storing section 10 of the second chip 3 is backed up in the first memory 6 of the first chip 2. Since the leak current in the first chip 2 is less than that in the second chip 3, the power consumption in the sleep mode can be reduced.

When the sleep mode is released, the first control circuit 7 of the first chip 2 reads and transmits the data backed up in the first memory 6 to the second chip 3. The second control circuit 9 of the second chip 3 writes the data transmitted from the first chip 2 to the data storing section 10 so that the data storing section 10 can return to its state before the sleep mode.

Thus, the first and second control circuits 7, 9 operate in conjunction with each other to perform the data transmission between the first and second chips 2, 3. Since the first and second control circuits 7, 9 are digital logic circuits, the first and second control circuits 7, 9 can be easily redesigned by using a conventional automatic layout generator for a digital logic circuit. Accordingly, the microcomputer 1 can be easily redesigned so that manufacturing cost of the microcomputer 1 can be reduced.

A power supply circuit is generally constructed with transistors having relatively large size. The power supply circuit 4 is included in the first chip 2 having the integration density less than that of the second chip 3. In such an approach, the integration density of the second chip 3 can be increased. The two-way terminals 18, 29 are used not only during the transition between the normal and sleep modes but also in the normal mode. In such an approach, the number of terminals of the first and second chips 2, 3 is reduced so that the size of the microcomputer 1 can be reduced.

(Modifications)

The embodiment described above may be modified in various ways. For example, the first and second chips 2, 3 can be manufactured with manufacturing processes other than the 350 nm, 150 nm manufacturing processes, respectively, as long as the leak current in the first chip 2 is less than that in the second chip 3.

At least one of the fillip-flops 27a, 27b, and the second memory 28 may store the data transmitted to and backed up in the first memory 6.

The delay circuit 11 can be eliminated from the first chip 2. In this case, the control circuit 7 controls the switch 5.

The second chip 3 may include a power supply circuit that is powered by the power supply circuit 4 and generates the second voltage.

Such changes and modifications are to be understood as being within the scope of the present invention as defined by the appended claims.

What is claimed is:

1. A microcomputer having a normal mode and a low power consumption mode, the microcomputer comprising:
    a first chip including a first memory and manufactured with a first manufacturing process that determines a first leak current in the first chip;
    a second chip including a second memory and manufactured with a second manufacturing process that determines a second leak current in the second chip, the second leak current being greater than the first leak current, wherein
    at least one of the first and second chips has a power supply circuit for supplying a first voltage to the first chip and a second voltage to the second chip and has first means for interrupting the supply of the second voltage to the second chip in the low power consumption mode,
    the second chip has second means for transmitting first data stored in the second memory to the first chip during a first transition from the normal mode to the low power consumption mode, and
    the first chip has third means for writing the first data to the first memory.

2. The microcomputer according to claim 1, wherein
    the first chip has a first integration density, and
    the second chip has a second integration density greater than the first integration density.

3. The microcomputer according to claim 1, wherein
    the first chip has a first minimum line-width,
    the second chip has a second minimum line-width less than the first minimum line-width, and
    the first voltage is greater than the second voltage.

4. The microcomputer according to claim 1, wherein
    the third means reads and transmits the first data stored in the first memory to the second chip during a second transition from the low power consumption mode to the normal mode, and
    the second means writes the first data to the second memory such that the second memory returns to its state before the first transition.

5. The microcomputer according to claim 1, wherein
    the first chip includes the power supply circuit.

6. The microcomputer according to claim 1, wherein
    each of the first and the second chips has a terminal via which the first data is transmitted between the first and second chips during the first and second transitions, and
    second data is transmitted between the first and second chips via the terminal in the normal mode.

* * * * *